US011205670B2

(12) United States Patent
Van Arendonk

(10) Patent No.: US 11,205,670 B2
(45) Date of Patent: Dec. 21, 2021

(54) ALIGNMENT OF MULTIPLE IMAGE DICE IN PACKAGE

(71) Applicant: Teledyne Digital Imaging, Inc., Toronto (CA)

(72) Inventor: Anton Petrus Maria Van Arendonk, Waterloo (CA)

(73) Assignee: Teledyne Digital Imaging, Inc., Toronto (CA)

( * ) Notice: Subject to any disclaimer, the term of this patent is extended or adjusted under 35 U.S.C. 154(b) by 202 days.

(21) Appl. No.: 16/093,544

(22) PCT Filed: Apr. 15, 2016

(86) PCT No.: PCT/CA2016/050438
§ 371 (c)(1),
(2) Date: Oct. 12, 2018

(87) PCT Pub. No.: WO2017/177300
PCT Pub. Date: Oct. 19, 2017

(65) Prior Publication Data
US 2019/0067351 A1    Feb. 28, 2019

(51) Int. Cl.
*G02B 6/42*        (2006.01)
*H01L 27/146*      (2006.01)
(Continued)

(52) U.S. Cl.
CPC ...... *H01L 27/14618* (2013.01); *G02B 6/4224* (2013.01); *H01L 21/52* (2013.01);
(Continued)

(58) Field of Classification Search
CPC . H01L 23/544; H01L 23/054; H01L 23/3107; H01L 23/562; H01L 23/49833;
(Continued)

(56) References Cited

U.S. PATENT DOCUMENTS 5,047,371 A * 9/1991 Cherukuri ............... C03C 3/078
                                         257/E23.193
6,228,743 B1 * 5/2001 Chen ........................ G03F 9/70
                                         257/797
(Continued)

FOREIGN PATENT DOCUMENTS

JP    2002374030    12/2002
JP     200905553     3/2009
(Continued)

OTHER PUBLICATIONS

Extended European Search Report dated Oct. 22, 2019 for European Patent Application No. 16898163.7.
(Continued)

*Primary Examiner* — Matthew C Landau
*Assistant Examiner* — Eric K Ashbahian
(74) *Attorney, Agent, or Firm* — Ridout & Maybee LLP

(57) ABSTRACT

An image sensor assembly and a method for assembling. The assembly includes: a ceramic package; at least one wall raised from the ceramic package, one of the walls for dividing a first surface region and a second surface region of the ceramic package; a frame supported by the ceramic package; a first set of fiducial markers and a second set of fiducial markers visible on the frame; a first die for placement onto the first surface region, the first die including an image sensor and respective fiducial markers for alignment with the first set of fiducial markers; a second die for placement onto the second surface region, the second die including an image sensor and respective fiducial markers for alignment with the second set of fiducial markers; and at least one optical filter each associated with one of the dice and supported by at least one of the walls.

22 Claims, 5 Drawing Sheets

(51) Int. Cl.
*H01L 23/544* (2006.01)
*H01L 23/053* (2006.01)
*H01L 21/52* (2006.01)

(52) U.S. Cl.
CPC .......... *H01L 23/053* (2013.01); *H01L 23/544* (2013.01); *H01L 2223/54426* (2013.01); *H01L 2223/54473* (2013.01)

(58) Field of Classification Search
CPC ............. H01L 23/5389; H01L 23/3114; H01L 23/3121; H01L 23/49558; H01L 23/49861; H01L 2223/54426; H01L 2223/5442; H01L 2223/5448; H01L 2223/54486; H01L 21/52; H01L 2224/83121; H01L 27/14618; H01L 27/146–14893; H01L 2924/171; H01L 31/0203; G02B 6/3803; G02B 6/4224; G06K 5/04; Y10T 29/53178
See application file for complete search history.

(56) References Cited

U.S. PATENT DOCUMENTS

| | | | |
|---|---|---|---|
| 6,811,938 B2 | 11/2004 | Tutt et al. | |
| 6,873,024 B1 | 3/2005 | Prabhu et al. | |
| 2006/0035415 A1* | 2/2006 | Wood | H01L 27/14618 438/125 |
| 2011/0037883 A1* | 2/2011 | Lee | H01L 27/14623 348/273 |
| 2011/0316108 A1 | 12/2011 | Nihei | |
| 2012/0025341 A1 | 2/2012 | Van Arendonk | |
| 2012/0299159 A1* | 11/2012 | Chen | G03F 9/7084 257/620 |
| 2012/0329198 A1* | 12/2012 | Laird | H01L 27/1465 438/65 |
| 2013/0066264 A1 | 3/2013 | Matsummoto et al. | |
| 2013/0128106 A1* | 5/2013 | Tam | H04N 5/2254 348/374 |
| 2013/0161837 A1* | 6/2013 | Chen | H01L 23/49838 257/783 |
| 2013/0266264 A1* | 10/2013 | Tomita | G02B 6/4224 385/52 |
| 2015/0122411 A1 | 5/2015 | Rodda et al. | |
| 2016/0218129 A1* | 7/2016 | Liu | H01L 27/14687 |
| 2018/0026068 A1* | 1/2018 | Ogi | H01L 27/14636 257/432 |
| 2018/0113378 A1* | 4/2018 | Wang | H04N 5/2258 |
| 2019/0075283 A1* | 3/2019 | Chinnock | H04N 5/2258 |

FOREIGN PATENT DOCUMENTS

| | | |
|---|---|---|
| WO | 2004015432 | 2/2004 |
| WO | 2012086828 | 6/2012 |

OTHER PUBLICATIONS

International Search Report and Written Opinion dated Dec. 12, 2016 for PCT/CA2016/050438.

* cited by examiner

ALIGNMENT OF MULTIPLE IMAGE DICE IN PACKAGE

CROSS-REFERENCE TO RELATED APPLICATION(S)

This application is a U.S. nationalization under 35 U.S.C. § 371 of International Application No. PCT/CA2016/050438 filed Apr. 15, 2016 entitled ALIGNMENT OF MULTIPLE IMAGE DICE IN PACKAGE, the contents of which are herein incorporated by reference into the below DETAILED DESCRIPTION OF EXAMPLE EMBODIMENTS.

FIELD

Example embodiments relate to assembly of packaged image sensors.

BACKGROUND

A semiconductor image sensor can be referred to as a "die" or "chip".

In some systems which use multiple image sensors, heavy reliance on calibration using test patterns may be required after assembly in order to determine the exact relative positioning between image sensors and/or to adjust for any misalignment. As well, alignment between image sensors can be difficult heavily rely upon this type of calibration when the image sensors are placed onto different packages, for example.

Additional difficulties may be appreciated in view of the Detailed Description of Example Embodiments, herein below.

SUMMARY

In an example embodiment, there is provided an assembly, including: a ceramic package; at least one wall raised from the ceramic package, one of the walls for dividing a first surface region and a second surface region of the ceramic package; a frame supported by the ceramic package; a first set of fiducial markers and a second set of fiducial markers visible on the frame; a first die for placement onto the first surface region, the first die including an image sensor and respective fiducial markers for alignment with the first set of fiducial markers; a second die for placement onto the second surface region, the second die including an image sensor and respective fiducial markers for alignment with the second set of fiducial markers; and at least one optical filter each associated with one of the dice and supported by at least one of the walls.

For example, the frame can be formed of silicon for accurately and economically creating the fiducial markers.

In another example embodiment, there is provided an assembly, including: a ceramic package; a plurality of walls raised from the ceramic package, at least one of the walls for dividing surface regions of the ceramic package; a frame supported by the ceramic package; a plurality of sets of fiducial markers visible on the frame; a plurality of dice, each for placement onto a respective surface region, each including a respective image sensor, each including respective fiducial markers for alignment with one set of the fiducial markers; and a plurality of optical filters each associated with one of the dice and supported by at least one of the walls.

In another example embodiment, there is provided a method for assembling a package, the method including: supporting a frame using a ceramic package, a first set of fiducial markers and a second set of fiducial markers visible on the frame, at least one wall raised from the ceramic package, one of the walls for dividing a first surface region and a second surface region of the ceramic package; aligning a first die onto the first surface region, the first die including an image sensor and respective fiducial markers for aligning with the first set of fiducial markers, and bonding the first die to the first surface region; aligning a second die onto the second surface region, the second die including an image sensor and respective fiducial markers for aligning with the second set of fiducial markers, and bonding the second die to the second surface region; and bonding at least one optical filter each associated with one of the dice to at least one of the walls.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DETAILED DESCRIPTION OF EXAMPLE EMBODIMENTS

In accordance with an example embodiment, there is provided an assembly, including: a ceramic package; at least one wall raised from the ceramic package, one of the walls for dividing a first surface region and a second surface region of the ceramic package; a frame supported by the ceramic package; a first set of fiducial markers and a second set of fiducial markers visible on the frame; a first die for placement onto the first surface region, the first die including an image sensor and respective fiducial markers for alignment with the first set of fiducial markers; a second die for placement onto the second surface region, the second die including an image sensor and respective fiducial markers for alignment with the second set of fiducial markers; and at least one optical filter each associated with one of the dice and supported by at least one of the walls.

For example, the frame can be formed of silicon for accurately and economically creating the fiducial markers.

In accordance with another example embodiment, there is provided an assembly, including: a ceramic package; a plurality of walls raised from the ceramic package, at least one of the walls for dividing surface regions of the ceramic package; a frame supported by the ceramic package; a plurality of sets of fiducial markers visible on the frame; a plurality of dice, each for placement onto a respective surface region, each including a respective image sensor, each including respective fiducial markers for alignment with one set of the fiducial markers; and a plurality of optical filters each associated with one of the dice and supported by at least one of the walls.

In accordance with another example embodiment, there is provided a method for assembling a package, the method including: supporting a frame using a ceramic package, a first set of fiducial markers and a second set of fiducial markers visible on the frame, at least one wall raised from the ceramic package, one of the walls for dividing a first surface region and a second surface region of the ceramic package; aligning a first die onto the first surface region, the first die including an image sensor and respective fiducial markers for aligning with the first set of fiducial markers, and bonding the first die to the first surface region; aligning a second die onto the second surface region, the second die including an image sensor and respective fiducial markers for aligning with the second set of fiducial markers, and bonding the second die to the second surface region; and bonding at least one optical filter each associated with one of the dice to at least one of the walls.

Figure 1:
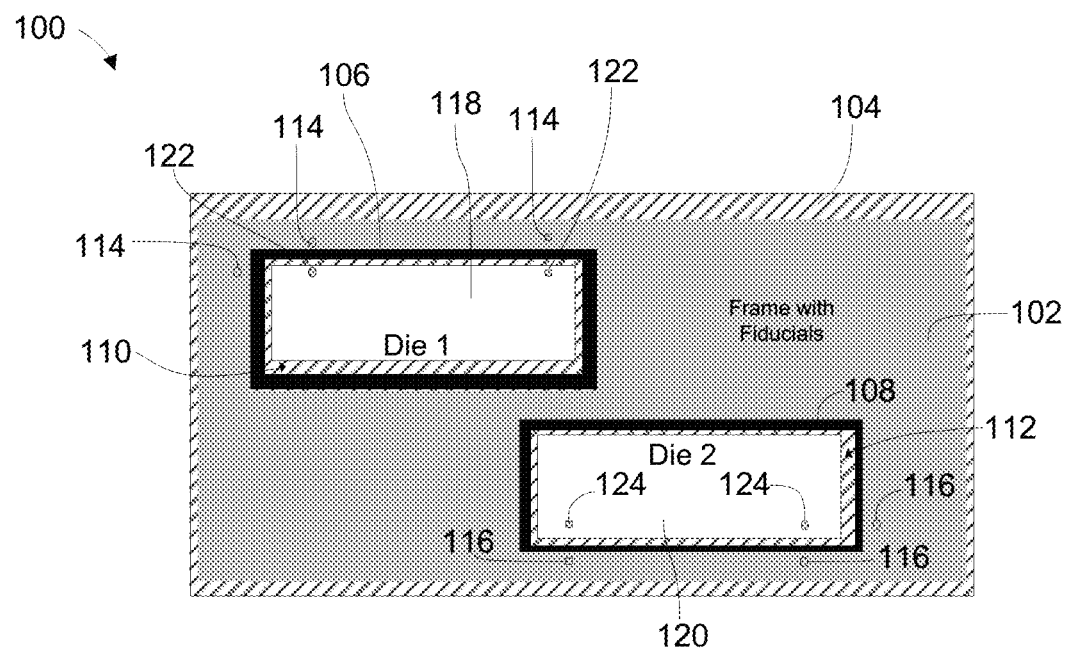
FIG. 1 illustrates a top diagrammatic view of an image sensor assembly which includes a frame, in accordance with an example embodiment.
Figure 2:
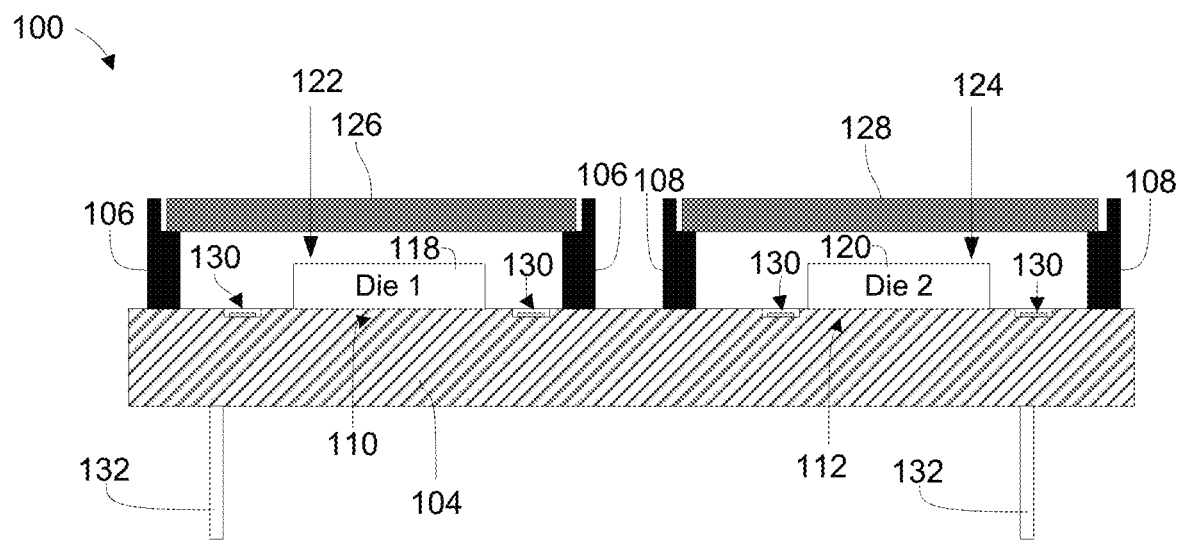
FIG. 2 illustrates a side sectional view of the assembly of FIG. 1, with the frame not shown for clarity.

Reference is first made to FIGS. 1 and 2, which illustrate an image sensor package 100 which includes a frame 102, in accordance with an example embodiment. The package 100 can be formed from an assembly of components, in an example embodiment. Generally, the frame 102 can be used to visually assist in the alignment of image sensor dice 118, 120 in relation to each other, with respect to lateral and rotational axes, for example.

The package 100 includes a ceramic package 104 for supporting of the contents thereon or therein. First walls 106 are shown as four walls in a rectangular configuration and second walls 108 are shown as four walls in a rectangular configuration. The walls 106, 108 are mounted to the ceramic package 104 and are upstanding (raised) from the ceramic package 104. As seen in FIG. 1, the first walls 106 can be used for dividing and defining a first surface region 110 of the ceramic package 104, and the second walls 108 can be used for dividing and defining a second surface region 112 of the ceramic package 104.

As shown in FIG. 1, the frame 102 is supported by the ceramic package 104 and typically placed or formed within or atop a surface of the ceramic package 104. A first set of fiducial markers 114 (three shown) are visible on the frame 102 and are located generally adjacent to the first surface region 110. A second set of fiducial markers 116 (three shown) are visible on the frame 102 and are located generally adjacent to the second surface region 112. As shown in FIG. 1, the frame 102 can be located exterior to the walls 106, 108 and can define a respective aperture at the location of the walls 106, 108.

A first die 118 is for placement onto the first surface region 110. A second die 120 is for placement onto the second surface region 112. The dice 118, 120 each include an image sensor (not shown for clarity) which can include an optically active portion in order to detect particular light or radiation. The dice 118, 120 can also be referred to as a "chip", for example. In an example embodiment, the dice 118, 120 are configured to provide a signal in proportion to an amount of detected light or radiation.

The first die 118 includes fiducial markers 122 (two shown) for alignment with the first set of fiducial markers 114. The second die 120 includes fiducial markers 124 (two shown) for alignment with the second set of fiducial markers 116. In the example shown, alignment can mean rectilinear alignment. The first die 118 and the second die 120 are aligned in two dimensional and rotational axes with respect to the frame 102. Therefore, the first die 118 and the second die 120 can be aligned with respect to each other in two dimensional and rotational axes.

As best shown in FIG. 2, a first optical filter 126 is bonded to the first walls 106 and a second optical filter 128 is bonded to the second walls 108. Prior to bonding of the optical filters 126, 128, the respective cavities can be filled with Nitrogen, in an example embodiment, or evacuated in other example embodiments. In an example embodiment, the optical filters 126, 128 comprise material of glass or sapphire. In an example embodiment, the optical filters 126, 128 comprise spectral filters. For example, the first optical filter 126 can have a different spectral property than the second optical filter 128. Since the dice 118, 120 are adjacent to each other, this can allow the optical filters 126, 128 to collectively act as a multispectral filter, and the image sensor package 100 to act as a multispectral detector which can keep separate the different detected spectral information or images.

In an example embodiment, the different optical filters 126, 128 can define Red, Green, Blue (RGB) filters for detecting the RGB color space (e.g., when there are at least three optical filters and dice). Another example type of optical filters can be from CMY color space with cyan, magenta and yellow filters (e.g., when there are at least three optical filters and dice). The size of the dice can be of a suitable size and alignment to be part of a pixel set to detect suitable detail, which can be used to keep data from the detected images into separate colors if desired. In other example embodiments, the filters can define any subpixels which are colors that define a color space. The dice can be arranged into triangular configurations when acting as pixels for a three color space, and into rectangular configurations when acting as pixels for a four color space, for example. In an example embodiment, at least one of the filter types can be used to filter radiation such as X-Ray or positron emission radiation for medical imaging purposes, for example.

In some example embodiments, the frame 102 comprises at least one of silicon material, glass-ceramic material, or Thermal Coefficient of Expansion (TCE) glass-ceramic material. In some example embodiments, the ceramic package 104 comprises Aluminum Nitride (AlN), for example. In some example embodiments, the ceramic package 104 can comprise other substrates and materials. In some example embodiments, the walls 106, 108 can comprise metal material. The walls 106, 108 can comprise other substrates and materials, such as silicon, in some example embodiments. The walls 106, 108 can be formed of optically opaque material to act as an optical barrier between the first die 118 and the second die 120, for example.

When the frame 102 is formed of silicon, the shape of the frame 102 can be formed wherein the apertures in the silicon can be defined by plasma or wet etch techniques using lithography of other masking techniques, for example. The fiducial markers 114, 116 can also be marked or otherwise added to the frame 102 at this time.

Referring now to FIG. 2, additional aspects of the package 100 can be seen. In an example embodiment, the ceramic package 104 can include recesses 130 for bonding sites, such as for receiving adhesive or epoxy (not shown here). Still referring to FIG. 2, the ceramic package 104 can be arranged as a pin grid array (PGA) package, for example having pins 132 or leads that can be inserted into a corresponding socket (not shown), for example as part of an imaging system (not shown). In an example embodiment, the ceramic package 104 can be approximately 170 mm×70 mm in topographical area, and can be other sizes in other example embodiments. Electrical connections (not shown for clarity) are made between the dice 118, 120 and the pins 132. A shape of the walls 106, 108 can also define grooves, ledges (as shown) and/or apertures to facilitate placement of the optical filters 126, 128.

Still referring to FIG. 2, the frame 102 is not shown for clarity. In an example embodiment, this is because the frame 102 can be releasable from the ceramic package 104 after the dice 118, 120 are mounted. Therefore, in an example embodiment the frame 102 and its fiducial markers 114, 116 can be re-used for facilitating alignment between another subsequent ceramic package and dice. In another example embodiment, not shown here, rather than being releasable, the frame 102 is bonded to the ceramic package 104 and can be enclosed within the ceramic package 104 by optical covers (not shown here) or otherwise part of the assembled package 100. The assembled package 100 can now be used to detect images or spectral radiation and to send signals in relation to the detected information.

While the package 100 is described with respect to first die 118 and second die 120, in an example embodiment, further dice (not shown) can be provided onto the same ceramic package 104. The frame 102 can include further respective fiducial markers (not shown) in order to align these additional dice. The plurality of dice can be arranged in suitable arrangements onto the ceramic package 104 such as an array, a grid, a concentric pattern, or other patterns. As described above, the dice can be arranged in pixel patterns which define a color space which can be grid or triangular, for example.

In an example embodiment, as can be seen in FIG. 1, the first set of fiducial markers 114 and the second set of fiducial markers 116 on the frame 102 are distinct fiducial markers to each other. In an alternate example embodiment, the first set of fiducial markers 114 and the second set of fiducial markers 116 on the frame share at least one same fiducial marker, for example.

Figure 3:
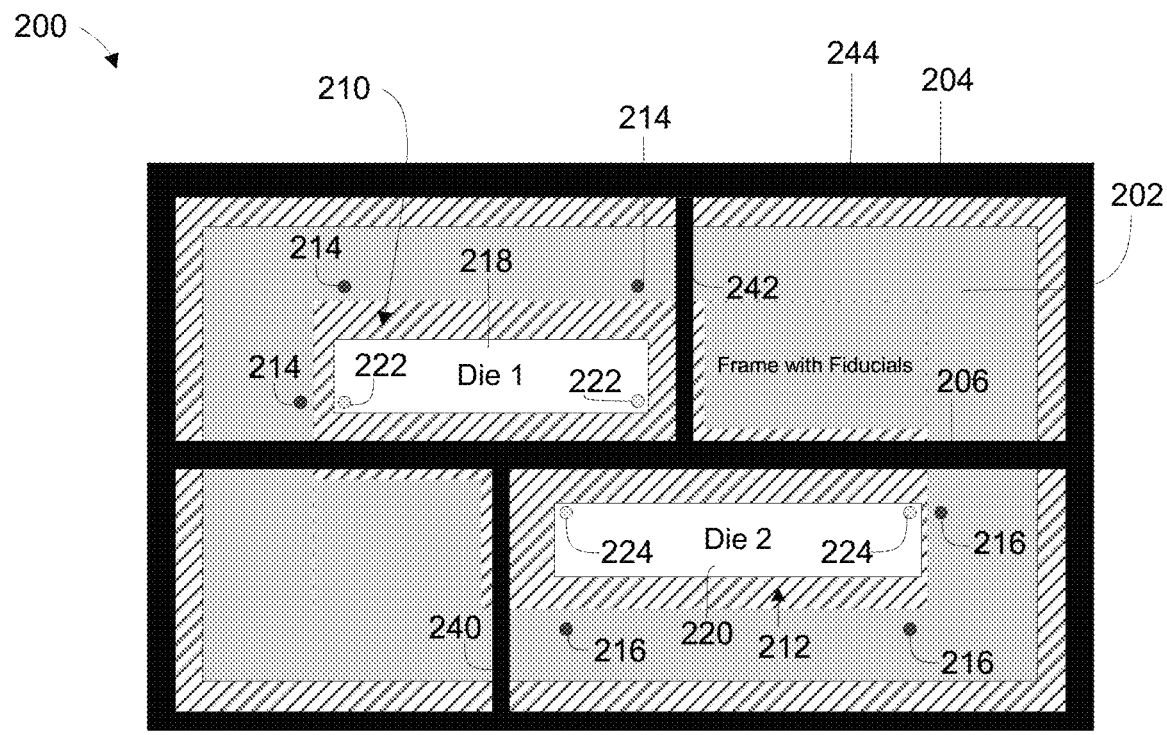
FIG. 3 illustrates a top diagrammatic view of an image sensor assembly, in accordance with another example embodiment.
Figure 4:
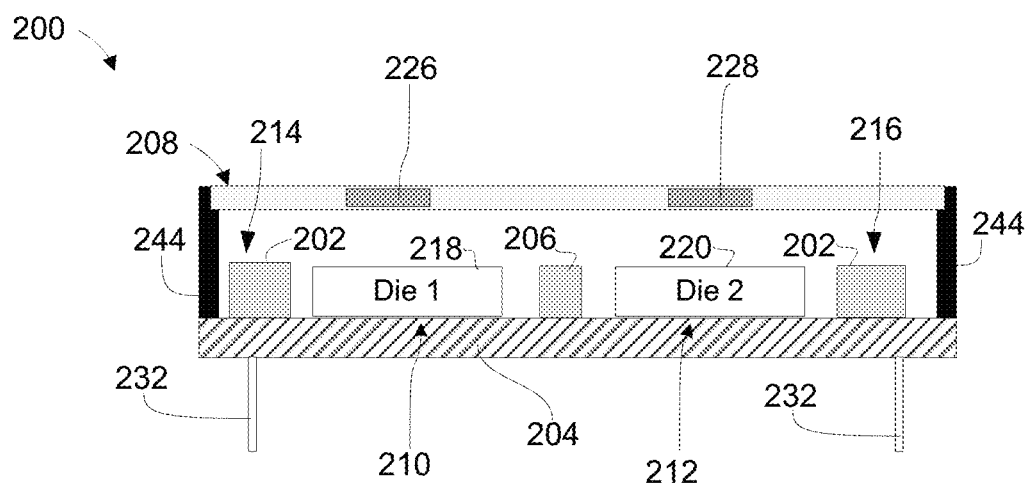
FIG. 4 illustrates a side sectional view of the assembly of FIG. 3.

Reference is now made to FIGS. 3 and 4, which illustrates another image sensor package 200, in accordance with another example embodiment. The package 200 is formed from an assembly of components, in an example embodiment. In the example embodiment shown, a single dividing wall 206 and a non-uniform optical cover 208 can be used (shown as a single piece).

The image sensor package 200 includes a ceramic package 204, and a frame 202 (e.g. silicon) supported by the ceramic package 204. The wall 206 is for dividing the ceramic package 204 into a first surface region 210 and a second surface region 212. As shown in FIG. 3, the frame 202 can define a respective aperture at the location of the first surface region 210 and the second surface region 212.

A first set of fiducial markers 214 (three shown) is visible on the frame 202, and a second set of fiducial markers 216 (three shown) is visible on the frame 202. A first die 218 is for placement onto the first surface region 210 and a second die 220 is for placement onto the second surface region 212.

The first die 218 includes respective fiducial markers 222 (two shown) for alignment with the first set of fiducial markers 214. The second die 220 includes respective fiducial markers 224 (two shown) for alignment with the second set of fiducial markers 216.

As shown in FIG. 4, the optical cover 208 can include a first optical filter 226 which optically covers the first die 218, and a second optical filter 228 which optically covers the second die 220. The remaining material of the optical cover 208 can be optically transparent, or another suitable material, for example.

Referring still to FIG. 3, additional walls 240, 242 can be provided for further dividing of the surface of the ceramic package 202. A surrounding perimeter wall 244 can be used for supporting and bonding of the optical cover 208. The walls 206, 240, 242, 244 can be formed of metal, in an example embodiment. The other walls 206, 240, 242 can also be used as further bonding sites for the optical cover 208, in an example embodiment.

Referring to FIG. 4, the ceramic package 204 can be arranged as a pin grid array (PGA) package, for example having pins 232 or leads that can be inserted into a corresponding socket (not shown), for example as part of an imaging system (not shown).

Figure 5:
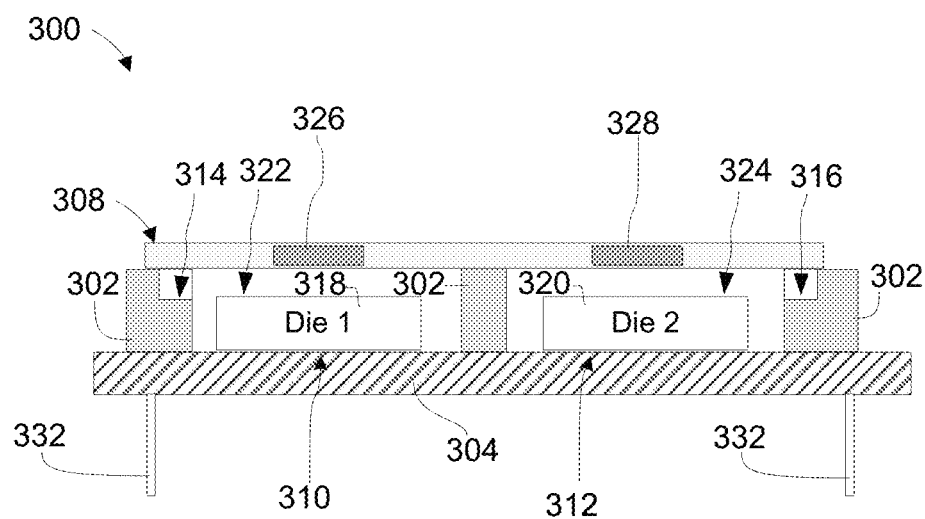
FIG. 5 illustrates a diagrammatic side sectional view of an image sensor assembly, in accordance with another example embodiment.

FIG. 5 illustrates a diagrammatic side sectional view of an image sensor package 300, in accordance with another example embodiment. In the example embodiment shown, the frame 302 (e.g. silicon) can be used to for alignment of fiducial markers as well as acting as one or more walls for supporting of an optical cover 308. In an example embodiment, the optical cover 308 is non-uniform and can be a single piece, as shown.

The image sensor package 300 includes a ceramic package 304, and a frame 302 (e.g. silicon) supported by the ceramic package 304. The frame 302 can also act as one or more walls for dividing the ceramic package 304 into a first surface region 310 and a second surface region 312. The frame 302 can define a respective aperture at the location of the first surface region 310 and the second surface region 312.

A first set of fiducial markers 314 is visible on the frame 302, and a second set of fiducial markers 316 is visible on the frame 302. A first die 318 is for placement onto the first surface region 310 and a second die 320 is for placement onto the second surface region 312. The dice 318, 320 each include an image sensor (not shown for clarity) which can include an optically active portion in order to detect particular light or radiation.

The first die 318 includes respective fiducial markers 322 for alignment with the first set of fiducial markers 314. The second die includes respective fiducial markers 324 for alignment with the second set of fiducial markers 316.

The optical cover 308 can include a first optical filter 326 which optically covers the first die 318, and a second optical filter 328 which optically covers the second die 320. The remaining material of the optical cover 308 can be optically transparent, or another suitable material, for example.

Referring still to FIG. 5, the frame 302 is used for supporting and bonding of the optical cover 308. The ceramic package 304 can be arranged as a pin grid array (PGA) package, for example having pins 332 or leads that can be inserted into a corresponding socket (not shown), for example as part of an imaging system (not shown).

Figure 7:
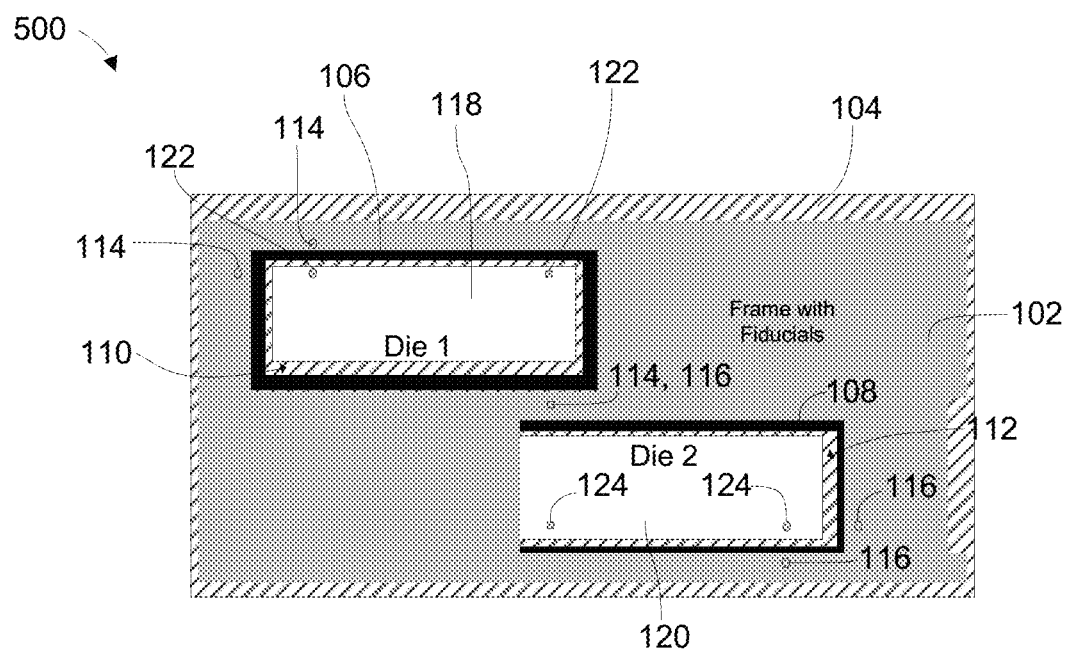
FIG. 7 illustrates a top diagrammatic view of another image sensor assembly which includes a frame, in accordance with another example embodiment.

Reference is now made to FIG. 7, which illustrates an image sensor package 500 in accordance with an example embodiment. The image sensor package 500 is similar to the image sensor package 100 shown in FIG. 1. In contrast to the image sensor package 100 shown in FIG. 1, in the image sensor package 500 of FIG. 7 the first set of fiducial markers 114 and the second set of fiducial markers 116 on the frame 102 share exactly one same fiducial marker 114, 116. The side sectional view of the image sensor package 500 (not shown) is similar to the image sensor package 100 shown in FIG. 2.

Figure 6:
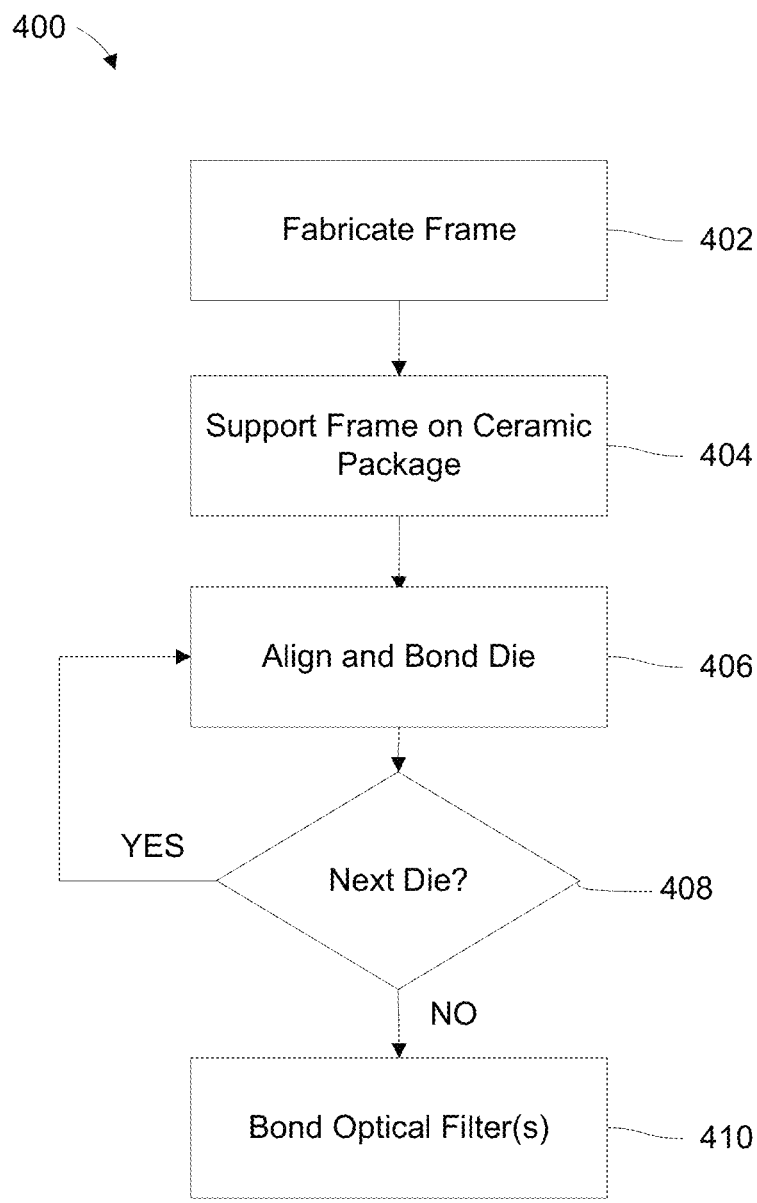
FIG. 6 illustrates an example flow diagram of a method for assembling an image sensor package, in accordance with an example embodiment.

FIG. 6 illustrates an example flow diagram of a method 400 for assembling an image sensor package, in accordance with an example embodiment. For example, a "pick and place" system which may be available from similar assembly operations can be used, in some example embodiments. Such systems can use vision control (e.g. camera), a controller, processor and/or computer (which can access memory which stores suitable instructions), and one or more electro-mechanical and/or electro-chemical devices to place and bond the desired components. An example of a pick and place system is made by Datacon™, for example. Additional components can be part of the pick and place system, including but not limited to sensors, a wafer saw, a die bonder, an ejector needle, a vacuum pick-up tool, an epoxy dispenser, an electromechanical pickup arm, an air pressure controller, a temperature controller (heat and/or cool), a vacuum, and/or ultraviolet light for curing, etc.

The method 400 will be described in relation to the package 100 for convenience of reference. Similar method or use may be applied to the other image sensor packages 200, 300 to assemble an image sensor package, as applicable. At event 402, the method 400 includes fabricating the frame 102, for example from silicon. The shape of the frame 102 can be formed wherein the apertures in the silicon can be defined by plasma or wet etch techniques using lithography of other masking techniques, for example. The fiducial markers 114, 116 can also be marked or otherwise added to the frame 102 at this time.

For example, using silicon as a frame material can provide very accurate placement of the fiducial markers 114, 116 to the frame 102. For example, being this accurate can facilitate the building and aligning of the dice image sensor dice 118, 120 very accurately with respect to each other, for example for creating an array of multiple rows of dice, all meeting the desired positional accuracy.

At event 404, the method 400 includes supporting the frame 102 using the ceramic package 104, for example. At event 406, the method 400 includes aligning the first die 118 onto the first surface region 110, for example using an electromechanical arm and a camera, by aligning the fiducial markers 122 of the first die 118 with the first set of fiducial markers 114, and bonding, for example using the epoxy dispenser, the first die 118 to the first surface region 110. At event 408, it is determined whether there is a next die to be mounted, for example the second die 120. If "yes", the method 400 can then repeat event 410, which includes aligning the second die 120 onto the second surface region 112, for example using the electromechanical arm and the camera, by aligning the fiducial markers 124 of the second die 120 with the second set of fiducial markers 116, and bonding, for example using the epoxy dispenser, the second die 120 onto the second surface region 112. Further dice can also be aligned and bonded, wherein events 406 and 408 are repeated as applicable until the number of specified dice is reached, in an example embodiment.

Once all of the dice are bonded, at event 408 it is determined that there are no more die to be aligned and bonded, e.g. "no" as shown in FIG. 6. At event 410, the method 400 includes bonding, for example using the epoxy dispenser, the optical filters 126, 128 to the respective walls 106, 108 to optically cover the respective dice 118, 120. The electromechanical arm and the camera can be used for placement of the optical filters 126, 128, for example.

In an example embodiment, the frame 102 is removed from the ceramic package 104. In another example embodiment, the frame 102 is bonded to the ceramic package 104 and remains part of the assembled package 100.

While the example image sensor packages are described with respect to first dice and second dice, in an example embodiment, further dice can be provided onto the same ceramic package. The plurality of dice can be arranged in suitable arrangements onto the ceramic package such as an array, a grid, a concentric pattern, or other patterns. As described above, the dice can be arranged in pixel patterns which define a color space which can be grid or triangular, for example.

Certain adaptations and modifications of the described embodiments can be made. Therefore, the above discussed embodiments are considered to be illustrative and not restrictive. Example embodiments described as methods would similarly apply to systems, and vice-versa.

Variations may be made to some example embodiments, which may include combinations and sub-combinations of any of the above. The various embodiments presented above are merely examples and are in no way meant to limit the scope of this disclosure. Variations of the innovations described herein will be apparent to persons of ordinary skill in the art, such variations being within the intended scope of the present disclosure. In particular, features from one or more of the above-described embodiments may be selected to create alternative embodiments comprised of a sub-combination of features which may not be explicitly described above. In addition, features from one or more of the above-described embodiments may be selected and combined to create alternative embodiments comprised of a combination of features which may not be explicitly described above. Features suitable for such combinations and sub-combinations would be readily apparent to persons skilled in the art upon review of the present disclosure as a whole. The subject matter described herein intends to cover and embrace all suitable changes in technology.

What is claimed is:

1. An image sensor assembly, comprising: a ceramic package; at least one wail raised from the ceramic package, one of the wails for dividing a first surface region and a second surface region of the ceramic package; a frame supported by the ceramic package; a first set fiducial markers and a second set of fiducial markers visible on the frame, a first die for placement onto the first surface region and contactless with the frame, the first die including a first, image sensor and respective fiducial markers for alignment with the first set of fiducial markers; a second die for placement onto the second surface region and contactiess with the frame, the second die including a second image sensor and respective fiducial markers for alignment with the second set of fiducial markers; and at least one optical filter each associated with one of the dice and supported. by at least one of the walls wherein the first set of fiducial markers and the second set of fiducial markers on the frame share exactly one same fiducial marker.

2. The image sensor assembly as claimed in claim 1, wherein the first set of fiducial markers on the frame is located adjacent to the first surface region, and wherein the second set of fiducial markers on the frame is located adjacent to the second surface region.

3. The image sensor assembly as claimed in claim 1, wherein each set of fiducial markers includes at least three fiducial markers, and each respective fiducial markers of each die includes at least two fiducial markers, for alignment of the first die and the second die to each other in two dimensional and rotational axes.

4. The image sensor assembly as claimed in claim 1, wherein the ceramic package defines recesses for bonding sites.

5. The image sensor assembly as claimed in claim 1, wherein the optical filter associated with the first die has a different spectral property than the optical filter associated with the second die.

6. The image sensor assembly as claimed in claim 1, wherein the at least one optical filter comprises more than one individual spectral property to collectively act as a multispectral filter.

7. The image sensor assembly as claimed in claim 1, wherein the at least one optical filter comprises material of glass or sapphire.

8. The image sensor assembly as claimed in claim 1, wherein the frame is releasable from the ceramic package.

9. The image sensor assembly as claimed in claim 1, wherein the frame is bonded to the ceramic package.

10. The image sensor assembly as claimed in claim 1, wherein the frame comprises silicon material or glass-ceramic material.

11. The image sensor assembly as claimed in claim 1, wherein at least one or all of the walls comprise metal material.

12. The image sensor assembly as claimed in claim 1, wherein the frame comprises at least one or all of the walls, wherein at least fiducial marker of the first set of fiducial markers or the second set of fiducial markers are located on at least one of the walls.

13. The image sensor assembly as claimed in claim 1, wherein the at least one optical filter comprises part of a non-uniform single piece optical cover.

14. Use of the image sensor assembly as claimed in claim 1 for detecting an image or spectral radiation.

15. An image sensor assembly, comprising:
a ceramic package;
a plurality of walls raised from the ceramic package, at least one of the walls for dividing surface regions of the ceramic package;
a frame supported by the ceramic package;
a plurality of sets of fiducial markers visible on the frame;
a plurality of dice, each for placement onto a respective surface region and contactless with the frame, each including a respective image sensor, each including respective fiducial markers for alignment with one set of the fiducial markers; and
a plurality of optical filters each associated with one of the dice and supported by at least one of the walls,
wherein a first set of the fiducial markers and a second set of the fiducial markers on the frame share exactly one same fiducial marker.

16. A method for assembling an image sensor package, comprising:
supporting a frame using a ceramic package, a first set of fiducial markers and a second set of fiducial markers visible on the frame, at least one wall raised from the ceramic package, one of the walls for dividing a first surface region and a second surface region of the ceramic package, wherein the first set of fiducial markers and the second set of fiducial markers on the frame share exactly one same fiducial marker;
aligning a first die onto the first surface region and contactless with the frame, the first die including a first image sensor and respective fiducial markers for aligning with the first set of fiducial markers, and bonding the first die to the first surface region;
aligning a second die onto the second surface region and contactless with the frame, the second die including a second image sensor and respective fiducial markers for aligning with the second set of fiducial markers, and bonding the second die to the second surface region; and
bonding at least one optical filter each associated with one of the dice to at least one of the walls.

17. The method as claimed in claim 16, wherein each set of fiducial markers includes at least three fiducial markers, and each respective fiducial markers of each die includes at least two fiducial markers, for alignment of the first die and the second die to each other in two dimensional and rotational axes.

18. The method as claimed in claim 16, wherein the optical filter associated with the first die has a different spectral property than the optical filter associated with the second die.

19. The method as claimed in claim 16, wherein the at least one optical filter comprises more than one individual spectral property to collectively act as a multispectral filter.

20. The method as claimed in claim 16, further comprising removing the frame from the ceramic package.

21. The method as claimed in claim 16, further comprising bonding the frame to the ceramic package.

22. The method as claimed in claim 16, wherein the ceramic package defines recesses for bonding sites.

* * * * *